(12) United States Patent
Wabiszczewicz

(10) Patent No.: US 7,008,236 B2
(45) Date of Patent: Mar. 7, 2006

(54) SET OF PRINTED CIRCUIT BOARDS COMPRISING REPLACEMENT BOARD

(75) Inventor: Zbigniew Wabiszczewicz, Zielona Gora (PL)

(73) Assignees: Advanced Digital Broadcast Polska Sp. zo.o., Zielona Gora (PL); Advanced Digital Broadcast Ltd., Taipei (TW)

( * ) Notice: Subject to any disclaimer, the term of this patent is extended or adjusted under 35 U.S.C. 154(b) by 0 days.

(21) Appl. No.: 10/827,904

(22) Filed: Apr. 20, 2004

(65) Prior Publication Data

US 2004/0245012 A1 Dec. 9, 2004

(30) Foreign Application Priority Data

Apr. 25, 2003 (PL) ....................................... 359888

(51) Int. Cl.
*H01R 12/00* (2006.01)

(52) U.S. Cl. ....................... 439/65; 29/402.08; 439/516

(58) Field of Classification Search ................ 439/516; 29/402.11, 413, 402.08, 832, 837, 839; 361/729, 361/777
See application file for complete search history.

(56) References Cited

U.S. PATENT DOCUMENTS

| | | | | |
|---|---|---|---|---|
| 3,131,140 A | * | 4/1964 | Brice, Jr. et al. | ................ 208/4 |
| 3,333,225 A | * | 7/1967 | McNutt | ........................ 439/75 |
| RE26,837 E | * | 3/1970 | Evans | ......................... 361/729 |
| 3,591,834 A | * | 7/1971 | Kolias | ......................... 361/791 |
| 3,765,076 A | | 10/1973 | Brandt | |
| 3,895,266 A | * | 7/1975 | Geiger | ........................ 361/785 |
| 4,216,523 A | * | 8/1980 | Harford | ....................... 361/729 |
| 4,816,789 A | * | 3/1989 | Mars | .......................... 333/246 |
| 5,031,073 A | * | 7/1991 | Chang | ......................... 361/778 |
| 5,263,868 A | * | 11/1993 | Renn et al. | ................... 439/67 |
| 5,270,673 A | * | 12/1993 | Fries et al. | ................. 333/246 |
| 5,471,016 A | * | 11/1995 | Krainer et al. | .............. 174/254 |
| 5,570,505 A | * | 11/1996 | Downie et al. | ............... 29/840 |
| 5,835,358 A | * | 11/1998 | Brakus | ........................ 361/791 |
| 6,188,583 B1 | * | 2/2001 | Fendt et al. | ................. 361/796 |
| 6,215,671 B1 | * | 4/2001 | Kalis | ........................ 361/784 |
| 6,481,098 B1 | | 11/2002 | Lin Chen et al. | |

* cited by examiner

*Primary Examiner*—Neil Abrams
(74) *Attorney, Agent, or Firm*—Matthias Scholl

(57) ABSTRACT

A set of printed circuit boards consists of a main board with at least one fragment intended for replacement and at least one replacement board, wherein said main board has openings in the dielectric layer placed along the edge line of the fragment intended for replacement, and between the openings there are bridges, and at least one of said bridges has an electric conductor thereon, and the replacement board has electric conductors in places matching the placement of the electric conductors of said bridges of the main board.

17 Claims, 7 Drawing Sheets

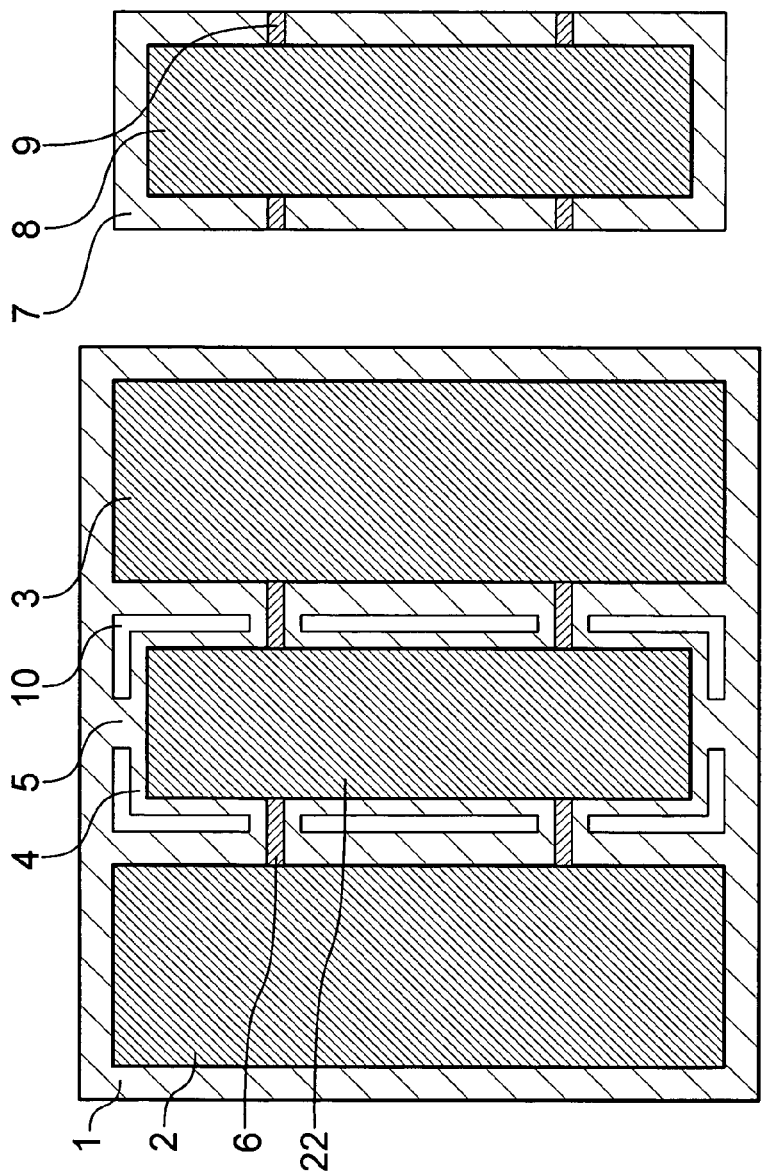

SET OF PRINTED CIRCUIT BOARDS COMPRISING REPLACEMENT BOARD

CROSS-REFERENCE TO RELATED APPLICATIONS

This application claims priority to Polish Application No. P-359888, filed Apr. 15, 2003, the contents of which are incorporated herein by reference.

BACKGROUND OF THE INVENTION

1. Field of the Invention

The present invention relates to a set of printed circuit boards, consisting of a main board, having at least one fragment intended for replacement, and at least one replacement board.

2. Brief Description of the Background of the Invention Including Prior Art

The U.S. Pat. No. 3,765,076 presents a printed circuit board having at least one defective contact along the edge thereof, which can be repaired by cutting away the defective contact and a portion of the underlying board to form a slot therein, and next a replacement terminal can be secured and electrically connected in place of the defective contact. However, that method refers only to contacts situated on the edge of the board and requires sophisticated tools to cut the contact away.

The U.S. Pat. No. 6,481,098 presents a method for manufacturing circuit boards where the defective circuit boards are cut and removed from the base plate and a spare unit is fixed in place of the defective board. That method is different from the present invention in the fact that its boards are not connected electrically and it refers to the production phase only (while the present invention refers to service phase).

SUMMARY OF THE INVENTION

Purposes of the Invention

It is an object of this invention to provide a set of printed circuit boards, consisting of a main board, having at least one fragment intended for replacement, and at least one replacement board, where the fragment intended for replacement may be replaced easily and without using sophisticated tools. This leads to lower costs of production and servicing of printed circuit boards. The replacement may take place when it is necessary to replace failed elements of the board or to change the functionality of a fragment of the board.

These and other objects and advantages of the present invention will become apparent from the detailed description, which follows.

Brief Description of the Invention

The set of printed circuit boards, according to the present invention, consists of a main board with at least one fragment intended for replacement and at least one replacement board, wherein said main board has openings in the dielectric layer placed along the edge line of the fragment intended for replacement, and between the openings there are bridges, and at least one of said bridges has an electric conductor thereon, and the replacement board has electric conductors in places matching the placement of the electric conductors of said bridges of the main board.

The openings in the dielectric layer can have the form of symmetrical geometric figures. Moreover, the openings may extend along the sides of the bridges and can be placed at the ends of the outer edges of the bridges, having a length smaller than one fourth of the bridge width.

Preferably, the bridges have a scratch on their top surface, marking the edge of cutting off the bridge.

The electric conductors can be electric wires or conducting paths.

Preferably, On the conducting paths of the replacement board, close to the edge, there can be pin-shaped contacts, and on the conducting paths of the main board, in places matching the placement of the pin-shaped contacts, there can be via holes with a diameter close to the diameter of the pin.

Preferably, on the conducting path of the bridge of the main board there can be a via hole, with walls covered with metal, and the conducting path of the replacement board can be connected by means of solder to the wall of the via hole.

The openings in the dielectric layer can be in the form of grooves of equal width, or in the form of perforation with circular or rectangular cross-section holes. The openings can also have the form of grooves of triangular or rectangular cross-section.

Preferably, the replacement board can have on its edges projections with conducting paths, reaching the border of the main board, and located in places matching the placement of the bridges of the main board.

The novel features, which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings one of the possible embodiments of the present invention is shown, where:

FIG. 1 illustrates a three-segment main board, the middle segment of which contains a fragment intended for replacement, with electric active and passive elements.

FIG. 2 presents a replacement board with electric active and passive elements.

Throughout the drawings, the same reference numerals indicate similar or corresponding features or functions. The drawings are not necessarily to scale; instead the emphasis is placed upon illustrating the principles of the invention.

DESCRIPTION OF INVENTION AND PREFERRED EMBODIMENT

Figure 3:
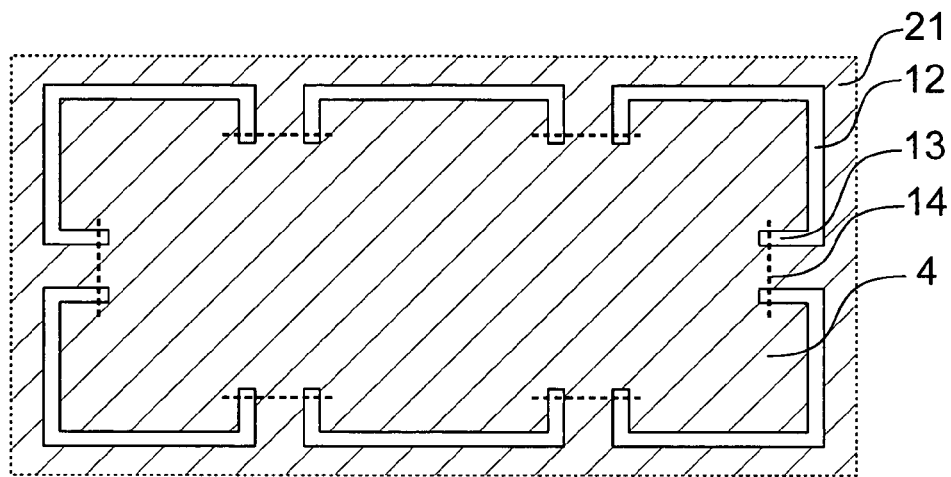
FIG. 3 shows a single-segment main board with a fragment intended for replacement, with bridges having a scratch, which marks the bridge cutting edge.

FIG. 1 shows a three-segment main board 1, which includes a first fragment 2 with active and passive electric elements, a second fragment 3 with active and passive electric elements and a third fragment, intended for replacement 4, having a quadrilateral shape, including an area 22 with active and passive electric elements. There are openings in the dielectric layer placed regularly along the border line of the fragment intended for replacement 4, in the form of single-section and double-section grooves 10 of equal width. The sections of the double-section grooves 10 are perpendicular to each other. Between the single-section and the double-section grooves and between only two of the double-section grooves 10 there are bridges 5 with a conducting path 6 or without a conducting path.

FIG. 2 shows a replacement board 7 with conducting paths 9 in places which match the placement of the conducting paths of the bridges 5. The conducting paths 6 on bridges 5 constitute a galvanic connection between the fragment of the board intended for replacement 4 and fragments of boards 2 and 3 with electric active and passive elements. The conducting paths 9 on the replacement board 7 constitute a galvanic connection with fragment of the board 8 with active and passive electric elements.

Figure 6:
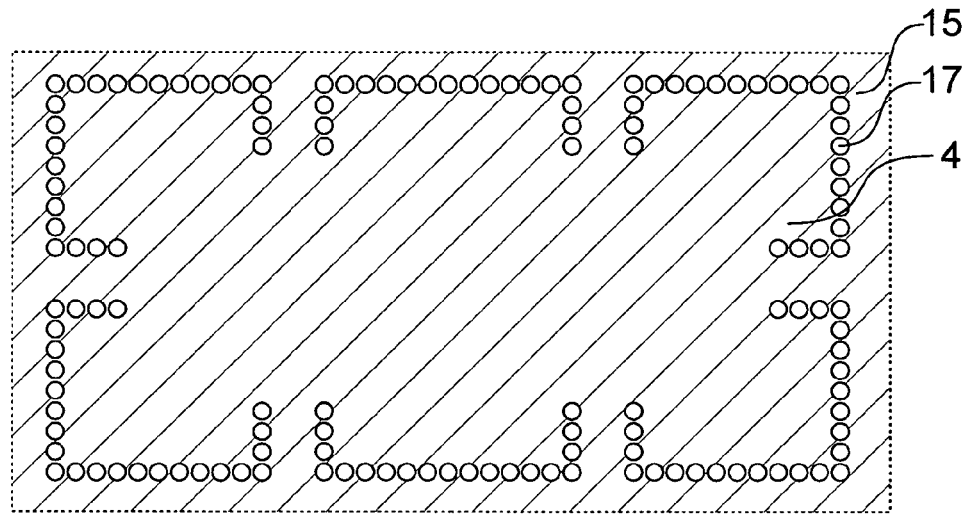
FIG. 6 shows a single-segment main board with a fragment intended for replacement, where the edge line is marked with a perforation with holes of circular cross-section.

As shown in FIG. 6, the openings in the dielectric layer between the fragment intended for replacement 4 and the edge of the main board 15 may also take the form of sections of perforation of a circular cross-section 17 or, in another embodiment, a rectangular cross-section.

FIG. 3 shows a main board 21 with sections of grooves 13 extending along the sides of the bridge, perpendicularly to the neighboring sections of grooves. They form a four-section groove 12 of uniform width. The bridges have on their top surface a scratch 14, which marks the edge of cutting off the bridge.

Figure 7:
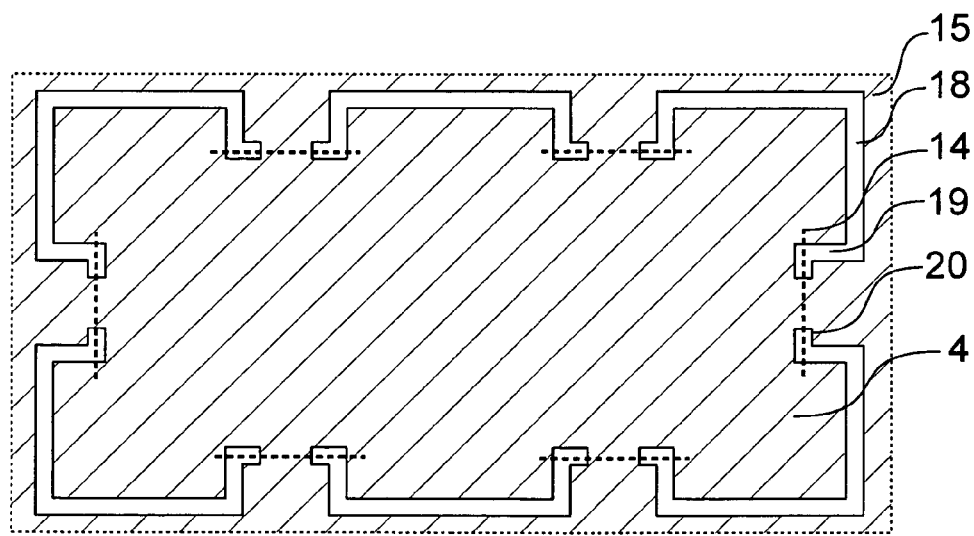
FIG. 7 shows a single-segment main board with a fragment intended for replacement, where the edge line is marked with multi-section grooves and scratches marking the bridge cutting edge.

As shown in FIG. 7, in order to facilitate easier removal of the fragment intended for replacement 4, there are additional sections 20 of grooves placed at the ends of the outer edge of the bridge. The sections 20 are preferably shorter than one fourth of the bridge width. They are perpendicular to the sections of groove 19 which extend along the sides of the bridge. This constitutes a six-section groove 18 of uniform width.

Figure 4:
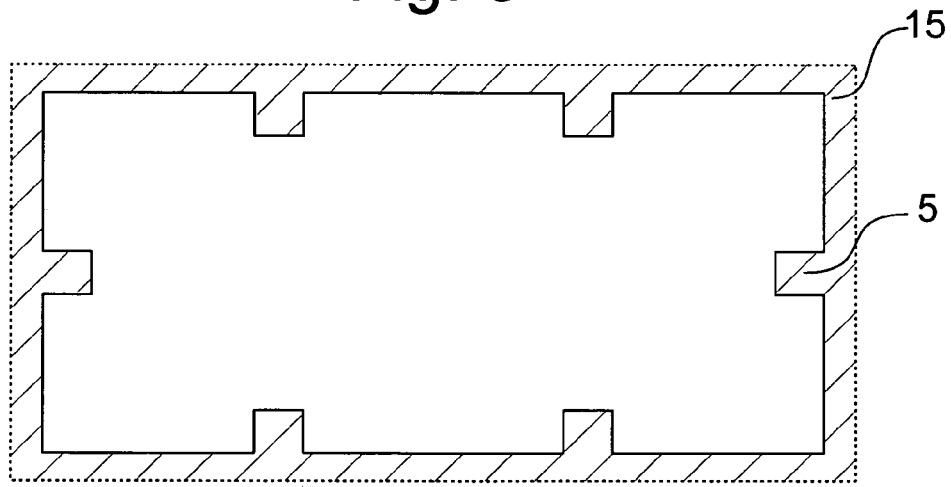
FIG. 4 illustrates the edge of a single-segment main board.

As shown in FIG. 4, after the fragment intended for replacement 4 is removed from the main board 21, there is left the edge of the main board 15 with fragments of bridges 5.

Figure 5:
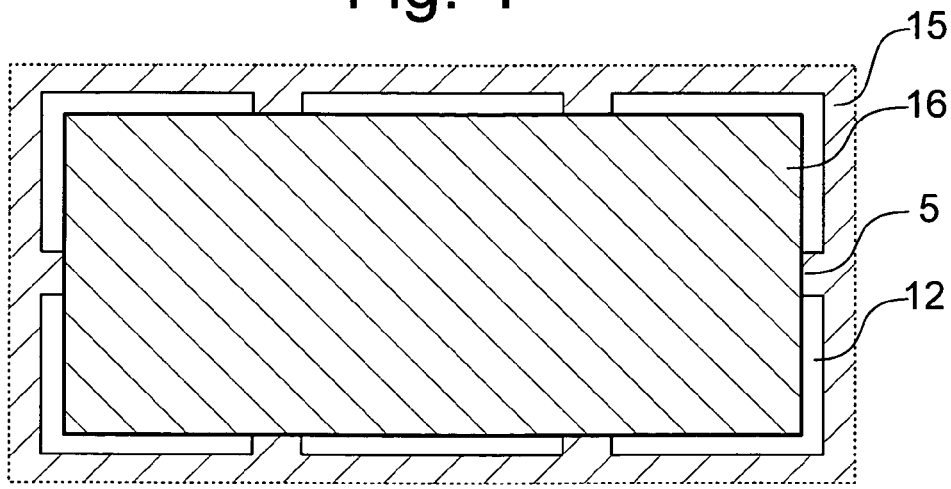
FIG. 5 presents a single-segment main board with a replacement board thereon.

FIG. 5 shows a replacement board 16, which is placed on the edge of the main board 15.

Figure 8:
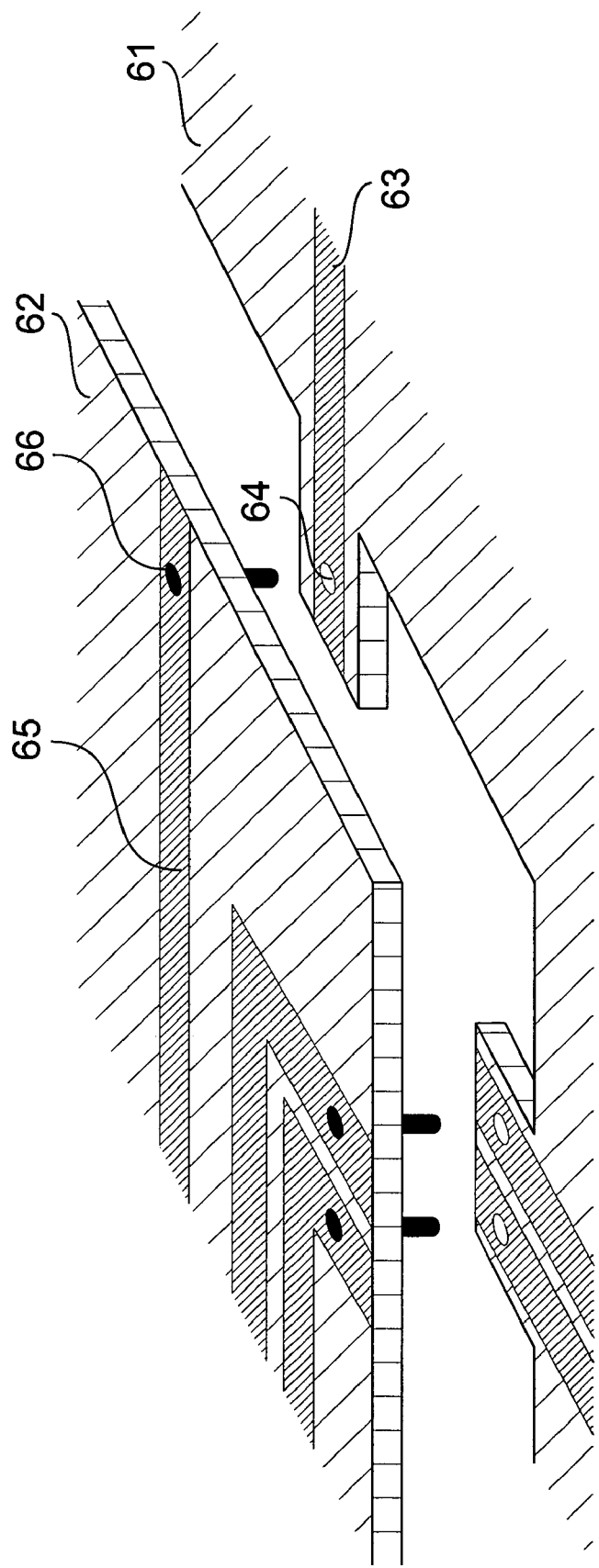
FIG. 8 shows the axonometric view of mechanical and galvanic connection of the edge of the main board with the replacement board by means of contacts in form of pins.

FIG. 8 shows pin-shaped contacts 66, which are used for galvanic and mechanical connection of the conducting path 63 at the edge of the main board 61 with the conducting path 65 of the replacement board 62. The main board has via holes 64 with a diameter similar to the diameter of the pin, such that the pin contact 66 fits into the hole 64.

Figure 9:
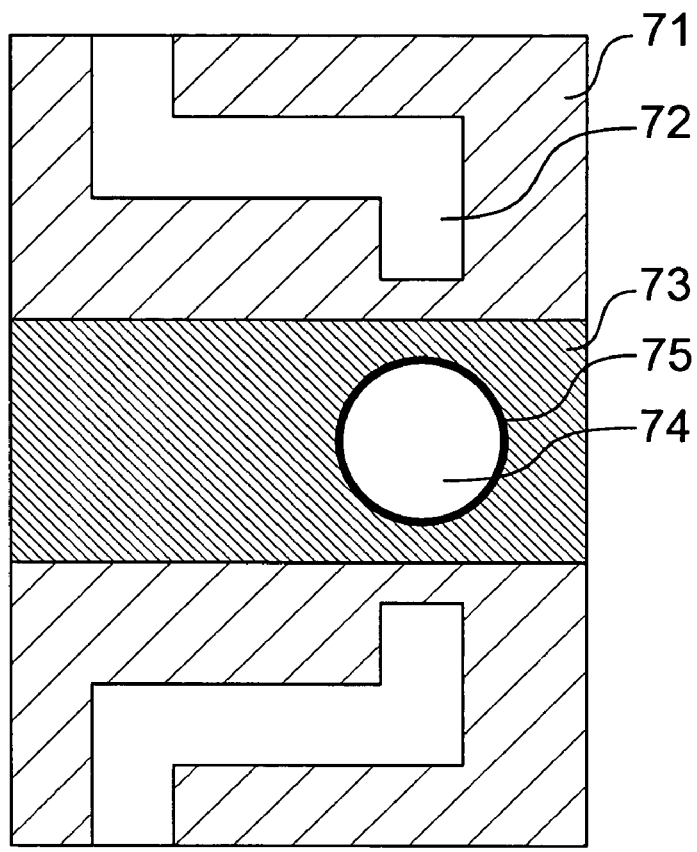
FIG. 9 presents a top view of a metalized hole in the conducting path of the bridge, which connects the edge of the main board with a fragment of the board intended for replacement.

FIG. 9 shows a via hole 74 on the conducting path 73 of the bridge, between the sections 72 of the openings in the dielectric layer located on the outer edge of the bridge. The via hole 73 is intended for connecting the edge of the main board 71 with the board intended for replacement. The side surface of the via hole 74 is covered with metal 75.

Figure 10:
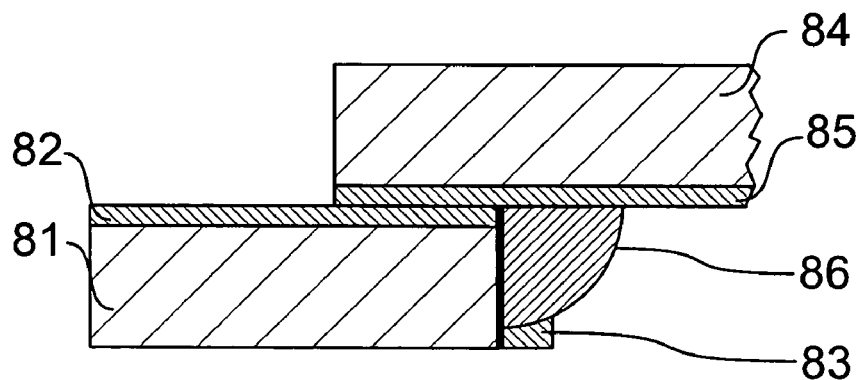
FIG. 10 illustrates galvanic connections of the conducting path of the main board with the conducting path of the replacement board.

As shown in FIG. 10, it is possible to permanently connect the edge of the main board 81 with the conducting path 82 and the replacement board 84 in such a way that the conducting path 85 of the replacement board 84 is connected by means of a solder 86 with the metal, which covers a part of the side surface of the hole 83, which is left after removing the fragment intended for replacement.

Figure 11:
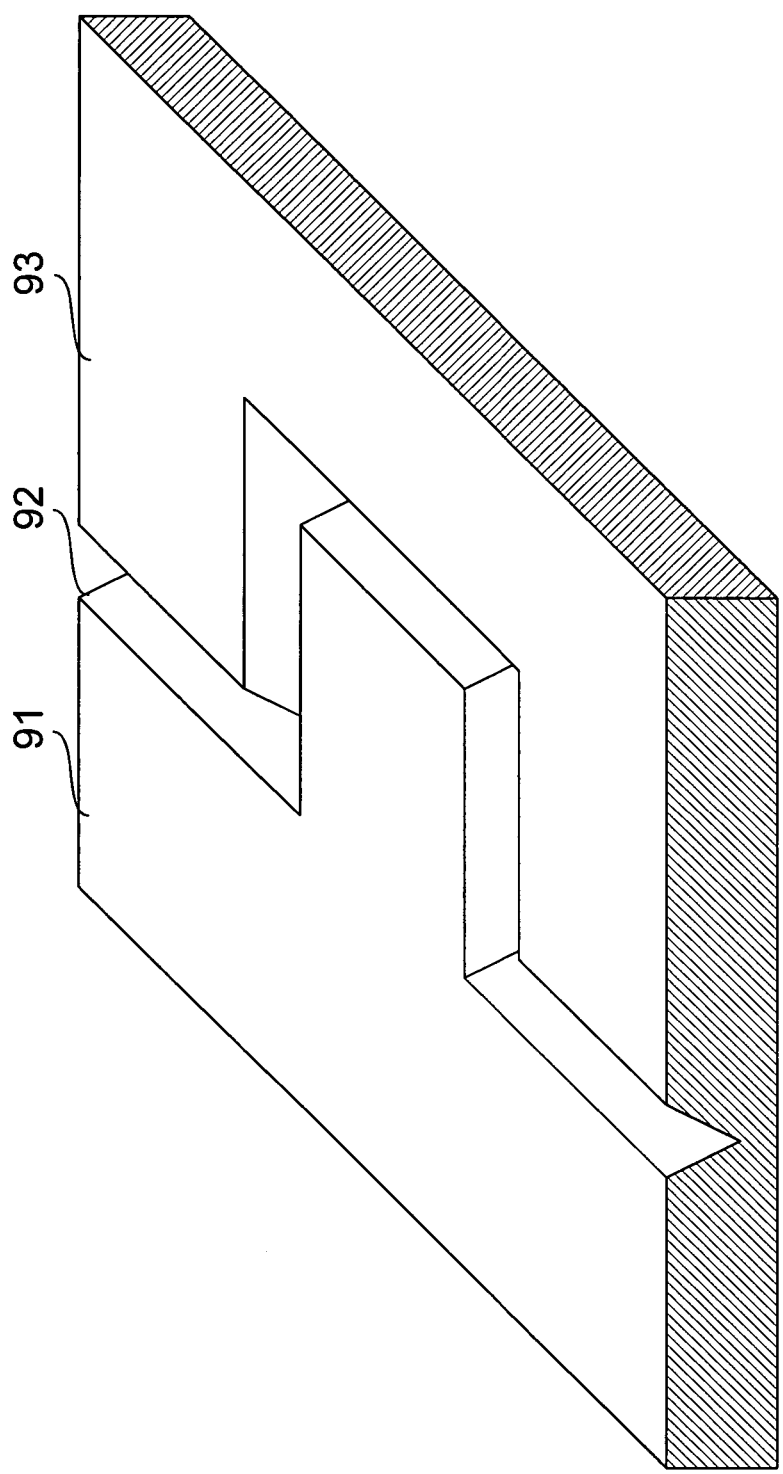
FIG. 11 shows the axonometric view of a part of the main board with a groove, which has a triangular cross-section.

FIG. 11 shows a main board 91 with a fragment intended for replacement 93, with sectional defects of dielectric layer in form of grooves 92 having a triangular or rectangular cross-section.

Figure 12:
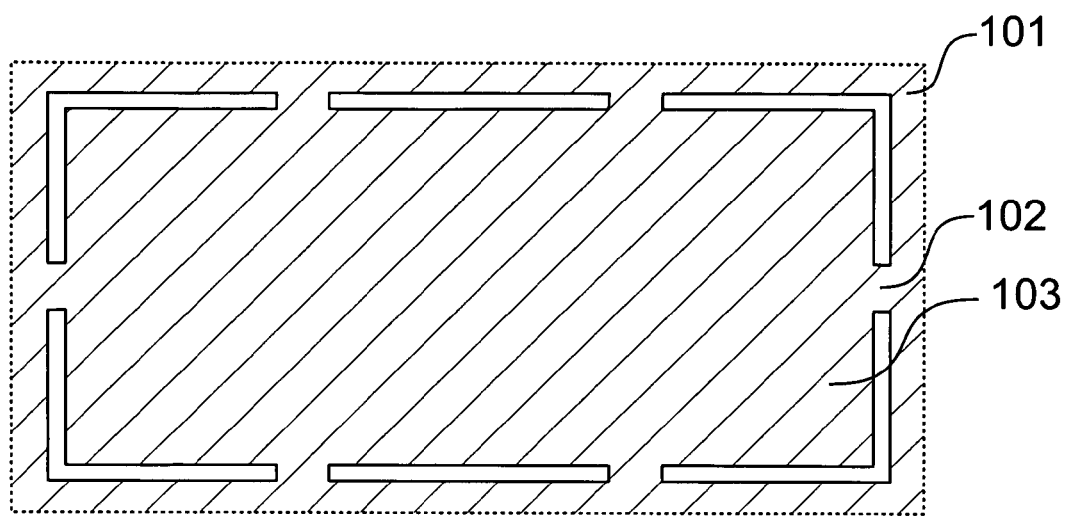
FIG. 12 shows a main board with a fragment intended for replacement.
Figure 13:
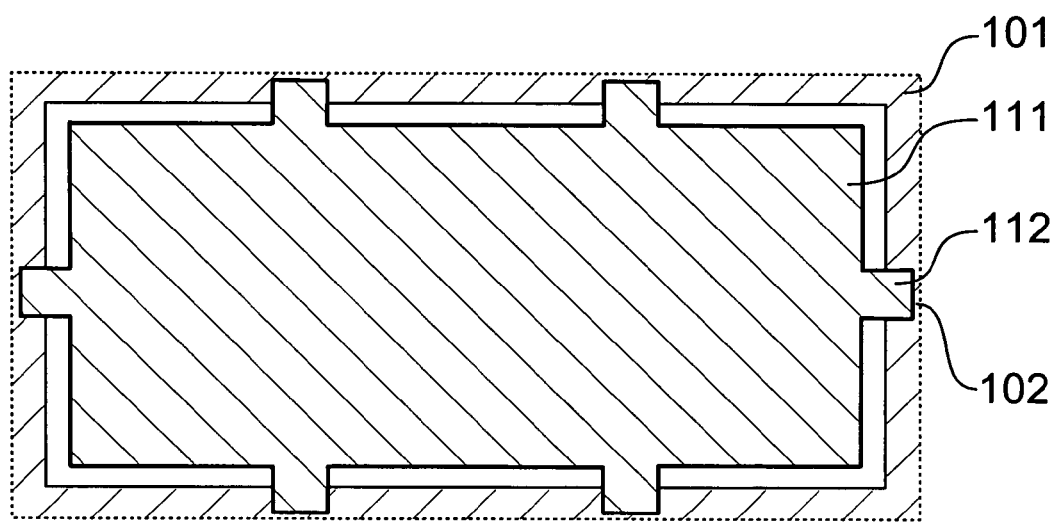
FIG. 13 shows a main board with a replacement board with projections placed on the main board.

As shown in FIG. 12 and FIG. 13, if the replacement board 111 has overall dimensions smaller than the fragment 103 of the board 101 intended for replacement, it may have on its edges additional projections 112 with conducting paths, reaching the border of the main board, and located in places matching the placement of the bridges 102 of the main board.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation and the teaching of the present invention without departing from the central scope. Therefore, it is intended that the present invention not be limited to the particular embodiment disclosed as the best mode contemplated for carrying out the present invention, but that the present invention include all embodiments falling within the scope of the appended claims.

What is claimed is:

1. A set of printed circuit boards, consisting of a main board with at least one fragment intended for replacement and at least one replacement board, wherein said main board has openings in the dielectric layer, the openings comprising a main section placed along the edge line of the fragment intended for replacement and extending sections placed perpendicularly at the ends of the main section; and between the openings there are bridges; and at least one of said bridges has a conducting path thereon; and the replacement board has conducting paths in places matching the placement of the conducting paths of said bridges.

2. A set of printed circuit boards according to claim 1, wherein the openings in the dielectric layer have the form of symmetrical geometric figures.

3. A set of printed circuit boards according to claim 1, wherein the openings further comprise additional sections placed perpendicularly at the ends of extending sections, additional sections having a length smaller than one fourth of the bridge width.

4. A set of printed circuit boards according to claim 1, wherein the bridges have a scratch on their top surface, marking the edge of cutting off the bridge.

5. A set of printed circuit boards according to claim 1, wherein on the conducting paths of the replacement board, close to the edge, there are pin-shaped contacts, and on the conducting paths of the main board, in places matching the placement of the pin-shaped contacts, there are via holes with a diameter close to the diameter of the pin.

6. A set of printed circuit boards according to claim 1, wherein on the conducting path of the bridge of the main board there is a via hole, with walls covered with metal, and the conducting path of the replacement board is connected by means of solder to the wall of the via hole.

7. A set of printed circuit boards according to claim 1, wherein the openings in the dielectric layer are in the form of grooves of equal width.

8. A set of printed circuit boards according to claim 1, wherein the openings in the dielectric layer are in the form of perforation with circular cross-section holes.

9. A set of printed circuit boards according to claim 1, wherein the openings in the dielectric layer are in the form of perforation with rectangular cross-section holes.

10. A set of printed circuit boards according to claim 1, wherein the openings of the dielectric layer have the form of grooves of triangular cross-section.

11. A set of printed circuit boards according to claim 1, wherein the openings of the dielectric layer have the form of grooves of rectangular cross-section.

12. A set of printed circuit boards according to claim 1, wherein the replacement board has on its edges projections with conducting paths, reaching the border of the main board, and located in places matching the placement of the bridges of the main board.

13. A set of printed circuit boards, consisting of a main board with at least one fragment intended for replacement and at least one replacement board, wherein
    said main board has openings in the dielectric layer, the openings comprising a main section placed along the edge line of the fragment intended for replacement; and
    between the openings there are bridges; and
    at least one of said bridges has a conducting path thereon with a via hole; and
    the replacement board has conducting paths and pin-shaped contacts in places matching the placement of the via holes of said bridges, the pin-shaped contacts having diameter close to the diameter of the via holes.

14. A set of printed circuit boards according to claim 13, wherein the openings further comprise extending sections placed perpendicularly at the ends of the main section.

15. A set of printed circuit boards according to claim 14, wherein the openings further comprise additional sections, placed perpendicularly at the ends of extending sections, said additional sections having a length smaller than one fourth of the bridge width.

16. A set of printed circuit boards, consisting of a main board with at least one fragment intended for replacement and at least one replacement board, wherein
    said main board has openings in the dielectric layer, the openings comprising a main section placed along the edge line of the fragment intended for replacement; and
    between the openings there are bridges; and
    at least one of said bridges has a conducting path thereon; and
    the replacement board has at its edges projections with conducting paths, the projections reaching the edge line of the main board, located in places matching the placement of the bridges of the main board.

17. A set of printed circuit boards according to claim 16, wherein on the projections of the replacement board with conducting paths, there are pin-shaped contacts, and on the conducting paths of the main board, in places matching the placement of the pin-shaped contacts, there are via holes with a diameter close to the diameter of the pin.

* * * * *